United States Patent [19]
Kässer

[11] Patent Number: 5,317,313
[45] Date of Patent: May 31, 1994

[54] METHOD AND APPARATUS FOR ANALOG/DIGITAL CONVERSION

[75] Inventor: Jürgen Kässer, Diekholzen, Fed. Rep. of Germany

[73] Assignee: Blaupunkt-Werke GmbH, Hildesheim, Fed. Rep. of Germany

[21] Appl. No.: 74,333

[22] Filed: Jun. 9, 1993

[51] Int. Cl.$^5$ .............................................. H03M 1/40
[52] U.S. Cl. ........................................ 341/163; 341/155
[58] Field of Search ............... 341/155, 158, 159, 161, 341/162, 163, 165, 143

[56] References Cited

U.S. PATENT DOCUMENTS

| 4,994,806 | 2/1991 | Yun-Tae | 341/155 |
| 5,101,205 | 3/1992 | yasuda | 341/155 |
| 5,241,312 | 8/1993 | Long | 341/163 |

OTHER PUBLICATIONS

Analog Devices, Data Sheet on Component AD902-8/AD9038, pp. 1–12, published Apr. 1989, Norwood, Mass.
Mitsubishi Semiconductors, Data Sheet on Components M5M5257P and M5M5257AP, pp. 3–65 & 3–70 in catalog entitled "Mitsubishi Semiconductors 1992 Memories SRAM," published Mar. 1992, Tokyo, Japan.

Primary Examiner—Sharon D. Logan
Attorney, Agent, or Firm—Frishauf, Holtz, Goodman & Woodward

[57] ABSTRACT

In an A/D converter for electrical signals, the difference, between the instantaneous analog input signal Y(t) and a previous analog signal value Y(t-T), is converted in a fast analog-to-digital converter (3) to a digital sum value. This sum value is added to the preceding digital value, stored in a buffer memory (7, 7′), and the result is fed to a slow but precise D/A converter (2) for generation of the next Y(t-T) value. This has the advantage that good results can be obtained with A/D converters less expensive than those heretofore required to obtain such results.

4 Claims, 1 Drawing Sheet

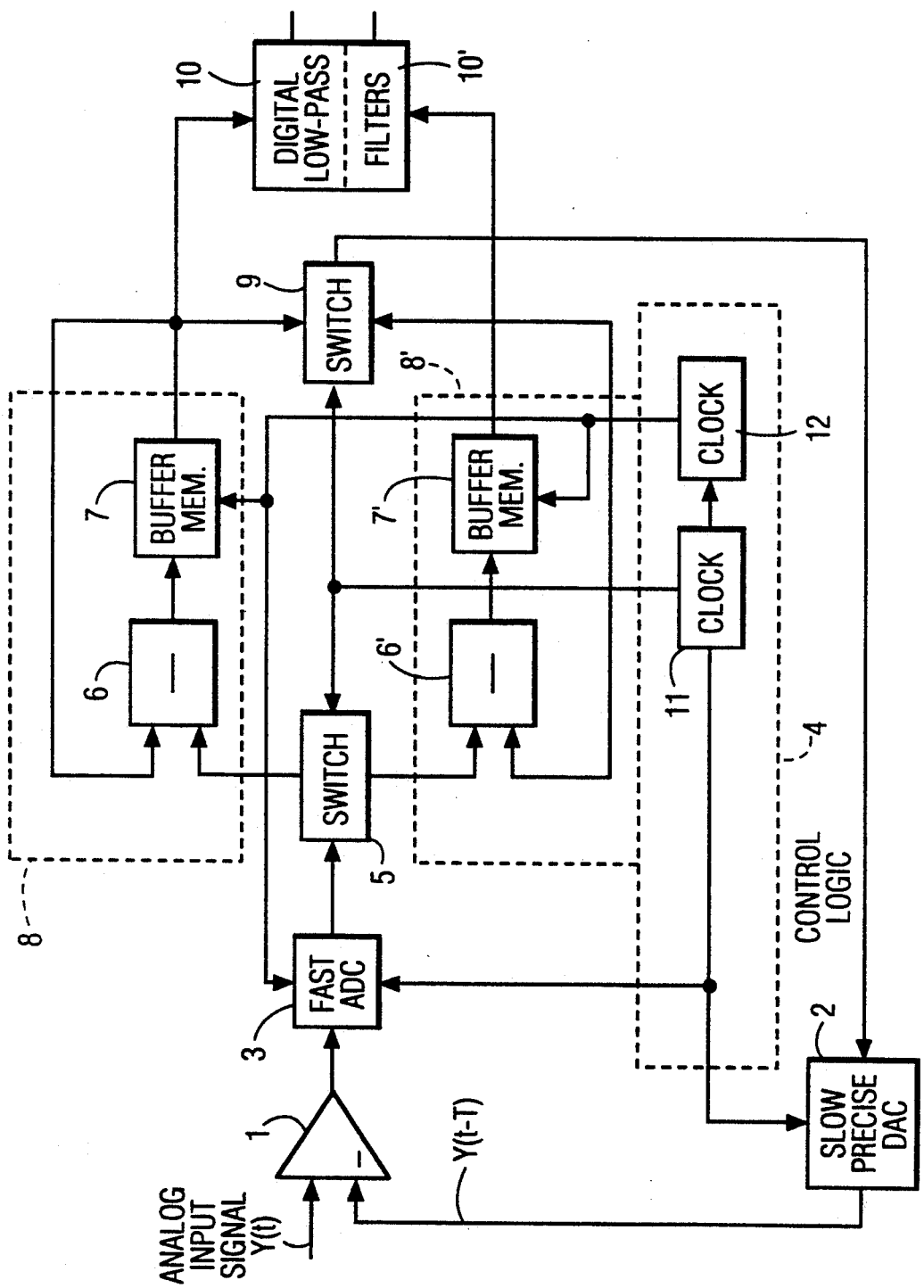

METHOD AND APPARATUS FOR ANALOG/DIGITAL CONVERSION

CROSS-REFERENCE TO MY RELATED APPLICATIONS, THE DISCLOSURES OF WHICH ARE HEREBY INCORPORATED BY REFERENCE

U.S. Ser. No. 07/735,059, filed Jul. 24, 1992 (docket 910377); U.S. Ser. No. 07/744,296, filed Aug. 13, 1992 (docket 910368).

CROSS-REFERENCE TO RELATED LITERATURE

Analog Devices datasheets on components DAC-16 & AD 9028; Mitsubishi buffer memory datasheet.

FIELD OF THE INVENTION

The present invention relates to a new method of converting analog frequency-modulated or phase-modulated signals into corresponding digital signals, and to an analog-to-digital converter which uses this method.

BACKGROUND

In conventional analog/digital (A/D) converters, there is no precondition on characteristics of the analog signal to be converted, apart from the criterion that the frequency, with which the analog signal can change, must be below twice the critical limit or sampling frequency of the A/D converter. The investment required to produce an A/D converter depends upon the precision and speed desired in the digital conversion.

"Precision" in this context means the number of bits which, after the conversion, are used to represent the original sampled analog value. In the following discussion, an 8-bit data word representation is considered imprecise, while a 14-bit digital signal value is considered very precise. "Speed" in this context is measured by the time which the converter needs to convert an analog signal into, for example, an 8-bit data word, or to convert a 14-bit-wide signal value into an analog signal. The conversion is considered slow if the response time or pull-in time of the converter approximates a quarter-period of the carrier frequency of the FM signal. The conversion is considered fast whenever the response time of the converter is short or small relative to the carrier period.

SUMMARY OF THE INVENTION

In seeking a way to reduce the expense needed to achieve signal conversion of a predetermined precision, I recognized that this problem can be more easily solved if one imposes boundary conditions or further characteristics on the analog signal to be converted, that is, if one narrows the operative range of the converter, e.g. to frequency-modulated or phase-modulated carriers. This means that the frequency bandwidth of the signal is limited, and is small relative to the carrier frequency. Given such carriers, the changes in the signal due to the frequency- or phase-modulation can be separated into a rapid carrier-induced change and a slower modulation-induced change. The conversion effects a mixing of the modulation into the base band (with displaced sampling). The modulation-induced changes then are represented as complex quantities or values.

Briefly, reduction of the investment needed for A/D conversion of the real and/or imaginary components of the modulation is achieved by adding the instantaneous value of the input signal to a stored value representing a previous instantaneous value, retarded by a predetermined phase angle of the carrier, converting the resulting analog sum value, in a fast A/D converter having a limited word length, into a digital difference value, subtracting, from the difference value, the digital previous instantaneous value, storing the result as a new digital instantaneous value, feeding the new instantaneous value to a low-pass filter, and feeding the new instantaneous value to a precise D/A converter which generates the analog previous instantaneous value. The evaluation of both signal components then is accomplished in a conventional evaluating signal processor (not shown).

DRAWING

FIG. 1 is a block diagram of an exemplary embodiment of the A/D converter of the present invention, which furnishes a base band complex signal.

DETAILED DESCRIPTION

In the drawing, the input signal for the circuit is a carrier signal with the intermediate frequency (IF) omega of a VHF broadcast receiver, which carrier frequency has been modulated with the quantity or function h(t), namely the broadcast program.

In accordance with the invention, the instantaneous value of input signal Y(t) has added to it, in a circuit element 1, a previously stored value Y(t-T). The resulting analog sum value is converted in a fast ADC (analog-to-digital converter) 3 into a digital sum value. From this digital sum value, a previously stored signal value is deducted. Since the sum signal is formed from two signals having different signs, the sum signal is small, relative to the total signal. A suitable ADC 3 is component AD 9028 made by Analog Devices. The converter is thus arranged so that its conversion range encompasses only a small part of the dynamic range of the input signal. For input signals outside the conversion range, the converter outputs a respective maximum value. The individual A/D converter steps are thus either smaller than, or equal to, those in the D/A (digital-to-analog) converter described below.

If the steps of the ADC (A/D Converter) and the DAC (D/A Converter) are the same size, the following example is valid: Given a complete range of the to-be-converted input signal from 0 volts to 5 volts, and given a desired conversion precision of 12 bits, the corresponding individual converter step is about 1.22 millivolts. The input ADC, with e.g. 6-bit wordlength, could cover an input range of about 64 steps×1.22 millivolts or about 78 millivolts, since a 6-bit word can have 64 values.

Upon switch-on the converter, its buffer memories for previously stored values contain the value zero, so the value substituted, in the above-described calculation, for the missing "previously stored value" is selected to be either the full instantaneous value of the input signal, or the end of the control range of the ADC. In subsequent process steps, to this value is added or subtracted the value of the difference, so that after several steps, the exact value of the input signal results.

Thereby, in spite of the short wordlength of the ADC, one obtains, in the buffer memory, a highly precise signal value, which is then fed to an evaluation processor.

The digital signal value in the buffer memory is also used in a feedback loop 9-2-1 through a slow, but highly precise, D/A converter 2 to generate the second analog signal Y(t-T) needed at the input of the circuit. A suitable DAC 2 is component DAC-16 manufactured by Analog Devices, Norwood, Mass.

FIG. 1 is a block diagram of an ADC which operates according to the above-described method, and makes available, to a downstream evaluation processor, both partial signals.

The analog input signal Y is summed in an adder 1 with the analog output signal Y(t-T) of a slow, but highly precise, D/A converter 2. The resulting analog sum signal is fed to a fast A/D converter 3 which outputs a digital value. As previously noted, a suitable ADC 3 is Analog Devices AD 9028.

A control logic 4 directs a switch 5 at the output of A/D converter 3 to alternately feed the digital values to a first processor 8, consisting of a first subtractor 6 and a first buffer memory 7, and to a second processor 8', consisting of a second subtractor 6' and a second buffer memory 7'. Suitable buffer memories are available from the firm MITSUBISHI as component no. M5 257.

Preferably, processor 8' operates at a phase angle 90 degrees retarded with respect to processor 8. The respective output signals of processors 8 and 8' are said to be "in quadrature" with respect to each other, and are fed to respective inputs of a second switch 9, which alternately applies these signals, in synchrony with switch 5, to the input of precise D/A converter 2, e.g. Analog Devices DAC-16. The output signals of processors 8 and 8' are directly applied to a respective digital low-pass filter 10 and 10'. The output signals of the low-passes are available to other downstream components (not shown).
*) that also conduct the time-matching of the modulation patterns of the two branches For example, the in quadrature signals at the outputs of processor 8 and 8' can be processed to obtain an ARI signal (ARI is U.S. Trademark Reg. No. 1,282,281 of Blaupunkt Werke GmbH for a radio traffic information system), and an RDS (Radio Data System) signal, respectively. Further details on RDS are set forth in European Broadcasting Union Technical Standard 3244-E, entitled SPECIFICATIONS OF THE RADIO DATA SYSTEM RDS FOR VHF/FM SOUND BROADCASTING (EBU Technical Centre, Brussels, Mar. '84, 60 pages). The output signals of 8 and 8' can represent a 57 kHz data subcarrier, whose processing has been described in numerous prior Blaupunkt U.S. patents.

A clock chip 11 in control logic 4 actuates both converters 2 and 3, and both switches 5 and 9, synchronously at a rate of 4/(4z+1) times the intermediate frequency, where z=0, 1 2 etc. The internal clock rate of processors 8 and 8' and that of A/D converter 3, is high relative to the converter rate, and is specified by a further clock chip 12 in control logic 4. Chips 11 and 12 can be any conventional clock chip. As noted above, the clock rate is a function of intermediate frequency omega, which is standardized by local broadcasting regulations. Therefore, no signal input to logic 4 is needed.

During a conversion, the following steps occur: ADC 3 receives a command "convert." The result of the conversion and the contents of memory 7 or 7' are subtracted in subtractors 6 and 6', respectively, and the respective results are stored in buffers 7 or 7', respectively. The contents of 7 or of 7' are applied to filters 10 or 10', respectively, and 7' or 7 are alternately applied to the input of DAC 2. DAC 2 converts.

After passage of (4z+1)/4 periods of the carrier, timed from the last A/D conversion, the next command "convert" goes to ADC 3; buffers 7 and 7' and subtractors 6 and 6' swap roles.

EXAMPLE 1

| | |
|---|---|
| instantaneous frequency excursion | 75 kHz |
| sampling/carrier frequency | 10.7 MHz |
| dynamic range: | 20 dB |
| Signal/noise ratio of baseband signal: | 60 dB |
| ADC bit length: | 6-bit wordlength |
| DAC bit length: | 12-bit wordlength. |

It will be apparent to those of ordinary skill in the art that various changes and modifications are possible, within the scope of the inventive concept.

What is claimed is:

1. A method of A/D conversion of a carrier-modulated input signal, comprising the steps of
   adding an instantaneous value of the input signal to a stored value representing an analog previous instantaneous value, retarded by a predetermined phase angle of a carrier;
   converting a resulting analog sum value, in a fast A/D converter having a limited word length, into a digital difference value;
   subtracting, from said difference value, a digital previous instantaneous value;
   storing the result as a new digital instantaneous value;
   feeding the new digital instantaneous value to a downstream circuit (10); and
   feeding the new digital instantaneous value to a precise D/A converter (2) which generates said analog previous instantaneous value.

2. A method according to claim 1, wherein said downstream circuit (10) is a low-pass filter.

3. Analog-to-digital converter for a frequency-modulated or phase-modulated analog signal, comprising
   an adder (1) having a first input, connected to said analog signal ($Y_n$), and a second input;
   a fast A/D converter (3) of limited wordlength, connected to an output of said adder (1);
   parallel first and second processor circuits (8, 8');
   a first selector switch (5) having an input connected to an output of said fast A/D converter (3) and two outputs, connected respectively to inputs of said processor circuits (8,8');
   a second selector switch (9) having inputs connected to respective outputs of said first and second processor circuits (8, 8'); and
   a precise D/A converter (2) having an output, connected to said second input of said adder (1), and an input connected to an output of said second selector switch, and wherein
   each of said processor circuits (8, 8') contains a subtraction stage (6, 6') and a buffer memory (7, 7'), the output of said buffer memory defining the processor circuit output, and each of said subtraction stages (6, 6') has two inputs, one of which defines the input of the processor circuit and the other of which is connected to the output of the processor circuit.

4. Converter according to claim 3, wherein the phase angle between two sampling values is (4z+1) times Pi/2, where z=0, 1, 2 etc.

* * * * *